US008203841B2

(12) United States Patent
Chang et al.

(10) Patent No.: US 8,203,841 B2
(45) Date of Patent: Jun. 19, 2012

(54) DATA CENTER

(75) Inventors: Yao-Ting Chang, Taipei Hsien (TW); Chao-Ke Wei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 41 days.

(21) Appl. No.: 12/916,610

(22) Filed: Oct. 31, 2010

(65) Prior Publication Data
US 2012/0063082 A1 Mar. 15, 2012

(30) Foreign Application Priority Data
Sep. 14, 2010 (TW) .............................. 99130949 A

(51) Int. Cl.
H05K 7/20 (2006.01)
F28F 7/00 (2006.01)
(52) U.S. Cl. ... 361/696; 361/694; 361/695; 165/104.33; 454/184
(58) Field of Classification Search ................... 361/695
See application file for complete search history.

(56) References Cited

U.S. PATENT DOCUMENTS

| | | | | |
|---|---|---|---|---|
| 6,374,627 B1* | 4/2002 | Schumacher et al. | ....... | 62/259.2 |
| 6,745,579 B2* | 6/2004 | Spinazzola et al. | ............... | 62/89 |
| 6,886,353 B2* | 5/2005 | Patel et al. | ...................... | 62/180 |
| 7,534,167 B2* | 5/2009 | Day | .............................. | 454/187 |
| 2008/0060372 A1* | 3/2008 | Hillis et al. | .................. | 62/259.2 |
| 2008/0291626 A1* | 11/2008 | Nelson et al. | ................. | 361/696 |
| 2010/0139887 A1* | 6/2010 | Slessman | ........................ | 165/67 |
| 2010/0252233 A1* | 10/2010 | Absalom | ......................... | 165/57 |
| 2012/0026676 A1* | 2/2012 | Chang | ..................... | 361/679.47 |

* cited by examiner

Primary Examiner — Gregory Thompson
(74) Attorney, Agent, or Firm — Altis Law Group, Inc.

(57) ABSTRACT

A data center includes a housing and a number of server module assemblies received in the housing. Airflow interspaces are formed between neighboring server module assemblies, and between the two outmost server module assemblies and corresponding sidewalls of the housing. The airflow interspaces are alternately used for cold aisles and hot aisles. An inside of each server module is communicated with one of the hot aisles and one of the cold aisles at opposite sides of the server module. A number of cooling units are installed in the housing over the server module assemblies. A number of fans are installed in the housing to draw hot air from the hot aisles to flow through the corresponding cooling units to be cooled, and the cooled air flow into the corresponding cold aisles, thereby creating air differences in air pressure between the cold aisles and the hot aisles.

8 Claims, 1 Drawing Sheet

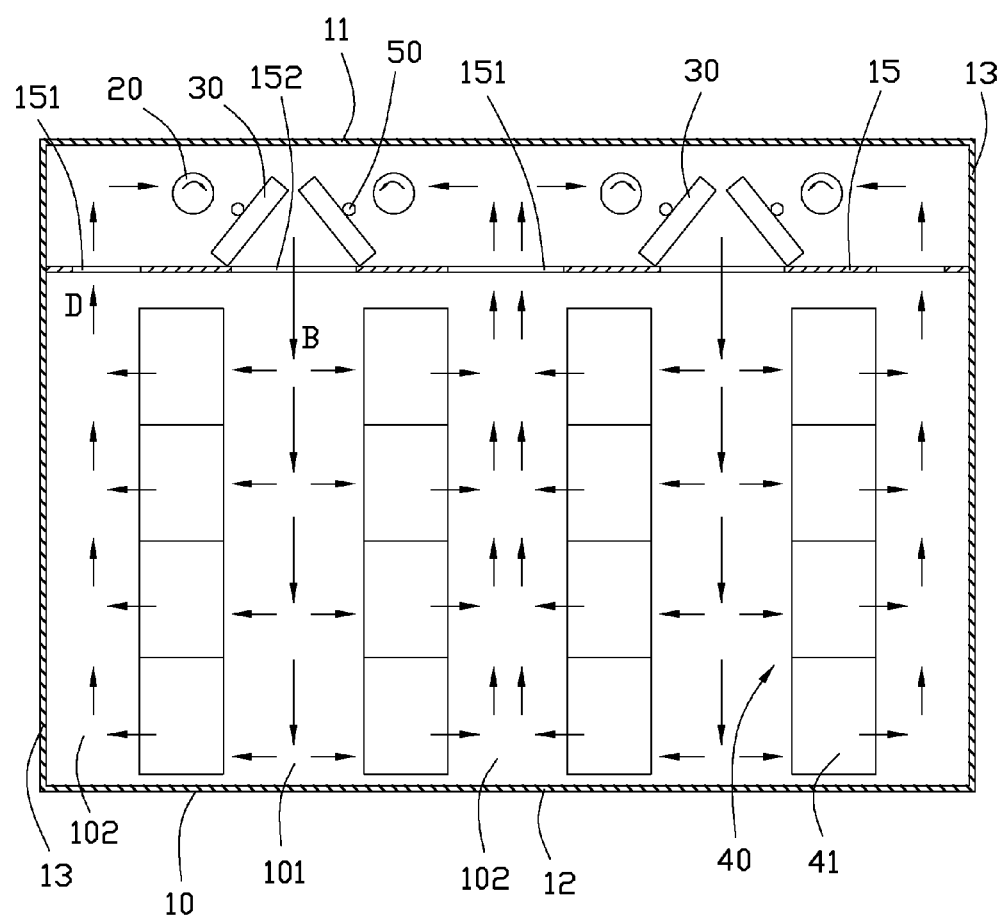

DATA CENTER

BACKGROUND

1. Technical Field

The present disclosure relates to a data center.

2. Description of Related Art

A data center usually includes a number of server modules arranged in a housing of the data center. One or more cooling fans are arranged in each of the server modules to dissipate heat for the server module. The cooling fans occupy much needed space, which may be used for accommodating more functional components to improve the capacity of the server module.

BRIEF DESCRIPTION OF THE DRAWING

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

The FIGURE is a sketch view of an embodiment of a data center.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

Referring to the FIGURE, an exemplary embodiment of a data center includes a housing 10. In one embodiment, the housing 10 is a large portable container. The housing 10 includes a top wall 11, a bottom wall 12 opposite to the top wall 11, and opposite left and right sidewalls 13 connected between the top wall 11 and the bottom wall 12. A number of spaced server module assemblies 40 are arranged in the housing 10. For ease of illustration, only four server module assemblies 40 are depicted in the FIGURE and described in this embodiment, but the number may be different in other embodiments. Each of the server module assemblies 40 includes a number of server modules 41 stacked upright. A number of venting holes (not shown) are defined in opposite sides of each of the server modules 41. Airflow interspaces are formed between every two adjacent server module assemblies 40, between the left outmost server module assembly 40 and the left sidewall 13, and between the right outmost server module assembly 40 and the right sidewall 13. The airflow interspaces are alternately configured as cold aisles 101 and hot aisles 102. In this embodiment, a partitioning plate 15 is mounted in the housing 10 adjacent to the top wall 11, forming a receiving space between the top wall 11 and the partitioning plate 15. The partitioning plate 15 defines a number of air inlets 151 aligned with the hot aisles 102, and a number of air outlets 152 aligned with the cold aisles 101. In alignment with each air outlet 152 are two cooling units 30, such as heat exchangers or water chillers, are arranged between the top wall 11 and the partitioning plate 15. Each two cooling units 30 incline towards each other. Fans 20 are received between the top wall 11 and the partitioning plate 15, and each fan 20 is respectively adjacent to a corresponding one of the cooling units 30.

When the devices in the data center operate, heat generated by the server modules 41 is dissipated into the hot aisles 102, the air in the hot aisles 102 is drawn into the receiving space through the corresponding air inlets 151, and is drawn to the corresponding cooling units 30 by the corresponding fans 20. The air is cooled by the cooling units 30, and then flows along the direction B into the corresponding cold aisles 101 through the corresponding air outlets 152. Therefore, differences in air pressure between the cold aisles 101 and the corresponding hole aisles 102 is created, with the air pressure in the cold aisles 101 being higher than the air pressure in the corresponding hot aisles 102. Due to the differences in air pressure, the cooled air in the cold aisles 101 is driven to flow into the server modules 41 to cool the server modules 41, and the heated air is expelled from the server modules 41 to the hot aisles 102. The heated air in the hot aisles 102 flows upwards in the direction D on the effect of nature convection and the fans 20.

Referring to description above, in the data center of the present disclosure, the differences in air pressure between the cold aisles 101 and the hot aisles 102 are created even if there are no fans mounted inside the server modules 41. It is unnecessary to mount fans in the server modules 41 for cooling the server modules 41. Therefore, the server modules 41 can contain more functional components, such as processors, storage devices, and so on.

Furthermore, a number of temperature sensing elements 50 can be arranged in the receiving space adjacent to the fans 20, for monitoring the temperature of the airflow near the fans 20. According to the temperature, the power of the fans 20 is adjusted to control the flowing speed of the airflow to make sure the temperature below a desired value. Therefore, the power of the fans 20 can be adjusted to be as low as possible but enough to satisfy a cooling requirement.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A data center comprising:
    a housing comprising a top wall, a bottom wall opposite to the top wall, and opposite left and right sidewalls connected between the top and bottom walls;
    a plurality of spaced server module assemblies arranged in the housing, wherein each of the server module assemblies comprises a plurality of server modules stacked upright, an airflow interspace is formed between every adjacent server module assemblies, the left outmost server module assembly and the left sidewall, and the right outmost server module assembly and the right sidewall, the airflow interspaces are alternately used for cold aisles and hot aisles, an inside of each of the server modules is communicated with a corresponding one of the hot aisles and a corresponding one of the cold aisles at opposite sides of each of the server modules;
    a plurality of cooling units arranged in the housing near the top wall and above the server modules; and
    a plurality of fans received in the housing, arranged above the server module assemblies, and each adjacent to a corresponding one of the plurality of cooling units, wherein the plurality of fans draw hot air from the hot aisles to flow through the corresponding cooling units to be cooled, and the cooled air flows into the corresponding cold aisles, thereby creating air differences in air pressure between the cold aisles and the hot aisles at opposite sides of the corresponding server module assemblies.

2. The data center of claim 1, wherein the differences in air pressure between the cold aisles and the corresponding hot aisles draw the cooled air in the cold aisles to flow through the server modules to cool the server modules, and expel the heated air from the server modules to the hot aisles.

3. The data center of claim 1, further comprising a partitioning plate mounted in the housing adjacent to and substantially parallel to the top wall, to form a receiving space between the top wall and the partitioning plate, wherein the partitioning plate defines a plurality of air inlets correspondingly aligning with the hot aisles, and a plurality of air outlets correspondingly aligning with the cold aisles.

4. The data center of claim 3, wherein the cooling units and the fans are located in the receiving space.

5. The data center of claim 3, wherein each of the air outlets is corresponding to two of the cooling units, the two cooling units are adjacent to the air outlet and incline towards each other.

6. The data center of claim 1, wherein the plurality of cooling units are heat exchangers or water chillers.

7. The data center of claim 1, further comprising a plurality of temperature sensing elements arranged in the housing adjacent to the plurality of fans, for sensing the temperature of the airflow near the plurality of fans.

8. The data center of claim 1, wherein the housing is a transportable container.

* * * * *